(12) United States Patent
Moberly

(10) Patent No.: US 6,484,280 B1
(45) Date of Patent: Nov. 19, 2002

(54) SCAN PATH TEST SUPPORT

(75) Inventor: David S. Moberly, Palo Alto, CA (US)

(73) Assignee: Agilent Technologies Inc., Palo Alto, CA (US)

( * ) Notice: Subject to any disclaimer, the term of this patent is extended or adjusted under 35 U.S.C. 154(b) by 0 days.

(21) Appl. No.: 09/409,936

(22) Filed: Sep. 30, 1999

(51) Int. Cl.[7] .............................................. G01R 31/28
(52) U.S. Cl. ...................... 714/726; 714/738; 714/741; 714/742; 703/13; 703/15
(58) Field of Search ........................ 714/726, 8, 727, 714/724, 731, 736, 737, 738, 729; 324/751; 703/13, 15, 14, 19; 712/220, 223, 225, 227

(56) References Cited

U.S. PATENT DOCUMENTS

| 4,853,622 A | * | 8/1989 | Brust | 324/751 |
| 5,475,624 A | * | 12/1995 | West | 703/15 |
| 5,812,561 A | * | 9/1998 | Giles et al. | 714/726 |
| 6,041,429 A | * | 3/2000 | Koenemann | 714/738 |
| 6,286,119 B1 | * | 9/2001 | We et al. | 714/726 |

* cited by examiner

Primary Examiner—Emmanuel L. Moise
(74) Attorney, Agent, or Firm—Robert T. Martin

(57) ABSTRACT

Functional testing of complex digital integrated circuits. A complex integrated circuit such as a system-on-a-chip (SOC) designed using high-level tools is tested by decomposing it into functional blocks wrapped by scan path cells. A tester which includes a field programmable gate array (FPGA) or similar device is connected to the SOC to be tested, and a simulation model of a chosen functional block of the SOC selected for test is loaded into the FPGA. A test pattern is applied to the functional block of the SOC using the scan path cells, and to the FPGA simulation. The FPGA may be rapidly reconfigured to test other functional blocks of the SOC.

16 Claims, 3 Drawing Sheets

SCAN PATH TEST SUPPORT

BACKGROUND OF THE INVENTION

1. Field of the Invention

The present invention deals with the testing of complex digital integrated circuits using scan path of functional blocks.

2. Art Background

Complex integrated circuits such as system-on-a-chip (SOC) devices must be tested during manufacture. Improvements in process technology and in design tools allow denser, more complex, and faster SOC devices to be designed. Higher levels of integration and fewer external pins, compared to the amount of on-chip functionality, results in the reduced accessibility of internal functional elements for testing.

Device testing is performed using automated test equipment (ATE). Improving the controllability and observability of internal nodes of a device-under-test (DUT) increases the testability and achievable fault coverage for a DUT. In order to test a DUT with a reasonable confidence of weeding out nonfunctional parts, access to internal nodes within a device is needed.

Access to otherwise inaccessible internal nodes can be obtained by designing scan path capability into a device to be tested which can then be accessed through a test access port (TAP). Suitable scan path and TAP architectures known to the art include IEEE 1149.1 Standard Test Access Port and Boundary-Scan Architecture.

Complex SOC devices are often designed and implemented as series of interconnected functional blocks, each of which can be tested independently. Each functional block can be surrounded by a test wrapper that consists of specific scan path cells. Scan path cells on selected input lines pass block input signals during normal operation, and pass shifted test signals during device test. Scan path cells on selected output lines latch specific block output signals. This arrangement allows for complex testing using a minimum of device pins. The input and output scan path cells are connected as long shift registers.

During test, (1) the operation of the device is stopped, (2) test vectors are clocked into input scan path cells, (3) the device clock toggled, and (4) the output scan path cells are clocked out and compared with a reference pattern to verify correct operation. This operation may be repeated thousands or millions of times. The potential fault coverage using this method may be quite high, but the amount of data that must be moved in and out of the device in serial fashion may result in significant test times.

Device testing is preferably performed at the actual operating speed of the DUT. The use of scan path capability does not allow continuous at-speed access to internal nodes of a device. Nevertheless, at-speed testing using scan path capability is known to the art by carefully controlling the device clock for one or more at-speed clock periods between the relatively long periods needed to load suitable test patterns.

Test patterns used for scan path testing are developed as is known to the art using one or more of the following schemes. First, actual device design data is used to generate block level structural test patterns, possibly reflecting expected defects and fault models. Next, behavioral models of the design in question may be used to develop functional test patterns. Finally, pseudo-random sequences may be used to automatically generate test patterns.

As with many other aspects of the semiconductor industry, time is money, and test time is expensive. What is needed is an improved approach to testing complex devices such as SOC devices.

SUMMARY OF THE INVENTION

An inexpensive system-on-a chip (SOC) device tester that makes use of SOC device design data, scan path, and reconfigurable logic. The SOC design is decomposed into functional blocks and surrounded by scan path cells. The high-level (Verilog or VHDL) simulation model of a chosen functional block, which is assumed to be correct, is loaded into a field programmable gate array (FPGA) or similar device. A test pattern is applied to the chosen functional block using the scan path cells, and is also applied to the FPGA simulation of the chosen block. After toggling the clock, the results are read out and compared. If the result vectors from the chosen functional block and its FPGA simulation fail to match, a record is created for further analysis. The FPGA may be rapidly reconfigured to test other blocks of the SOC device. The FPGA may also be used to provide appropriate signal levels on other pins of the SOC device.

BRIEF DESCRIPTION OF THE DRAWINGS

The present invention is described with respect to particular exemplary embodiments thereof and reference is made to the drawings in which.

DETAILED DESCRIPTION

Figure 1:
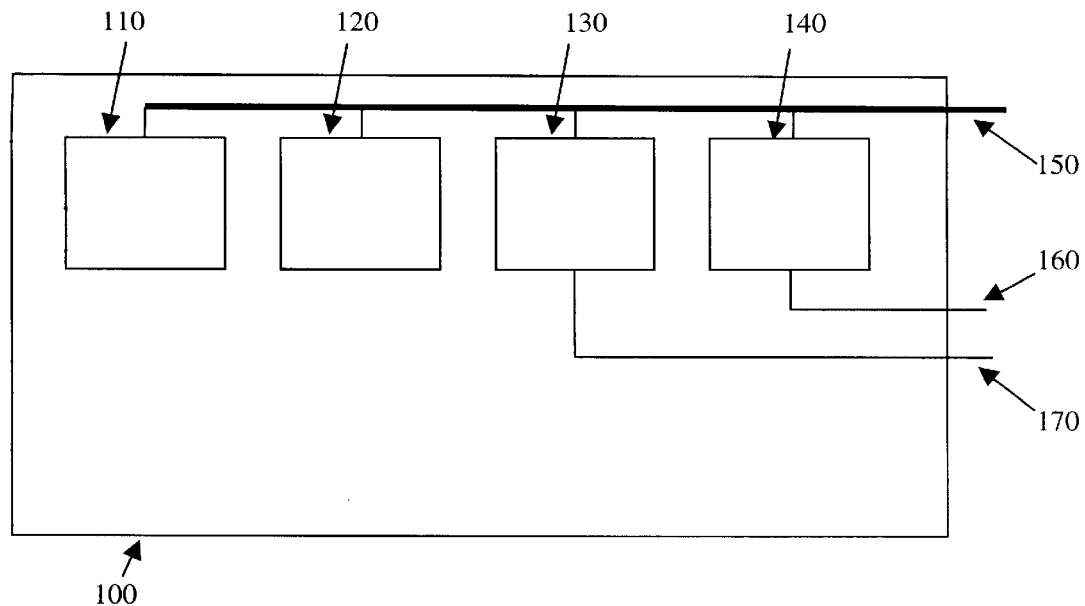
FIG. 1 shows a block diagram of a typical system on a chip (SOC)

FIG. 1 shows a typical system-on-a-chip (SOC) 100. This kind of complex integrated circuit typically contains processor 110, memory 120, and peripheral interfaces 130 and 140. Communications with the off-chip world is through peripheral lines 160, 170 and bus 150. These SOC integrated circuits are commonly synthesized using high level design tools from Verilog or VHDL sources. Large and complex functional blocks such as processors, DSPs, and complex interfaces are available as blocks or modules which may be dropped into a design. The resulting SOC design may be simulated in software, both at a functional block level and at a device level, to verify its operation. Software simulation is time consuming, and while valuable during debugging and verification, may not catch problems which may appear in the actual hardware during manufacturing test.

Figure 2:
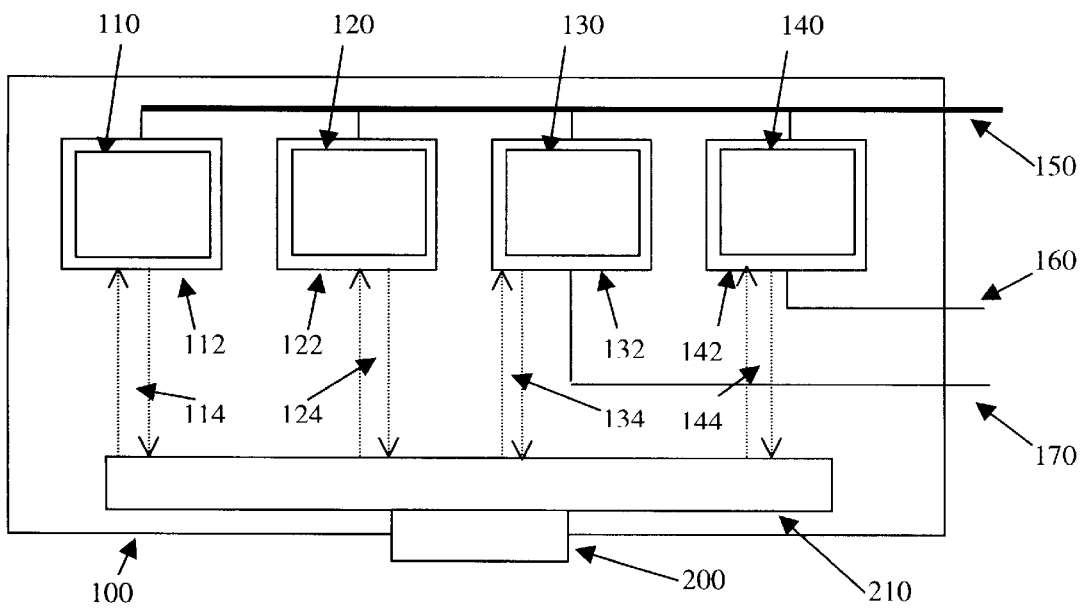
FIG. 2 shows a typical SOC with scan path.

Shown in FIG. 2 is a SOC to which scan path has been added. In the prior art, the entire device is wrapped in scan path cells. For the present invention, each of the functional blocks 110, 120, 130, and 140 are isolated for test by scan path wrappers 112, 122, 132, and 142. Each wrapper allows the inputs and outputs of the functional block to be intercepted in serial fashion through separate scan chains 114, 124, 134, 144. A specific scan chain may be selected by chain selector 210, which is controlled by test access port 200. Under access port control, lines in the selected functional block are set and read out, allowing the state of a functional block to be loaded, and then exercised. While these test chains provide a great deal of flexibility, and allow detailed structural tests to be performed, they are fairly slow, since they must move a large amount of data in a serial manner.

Figure 3:
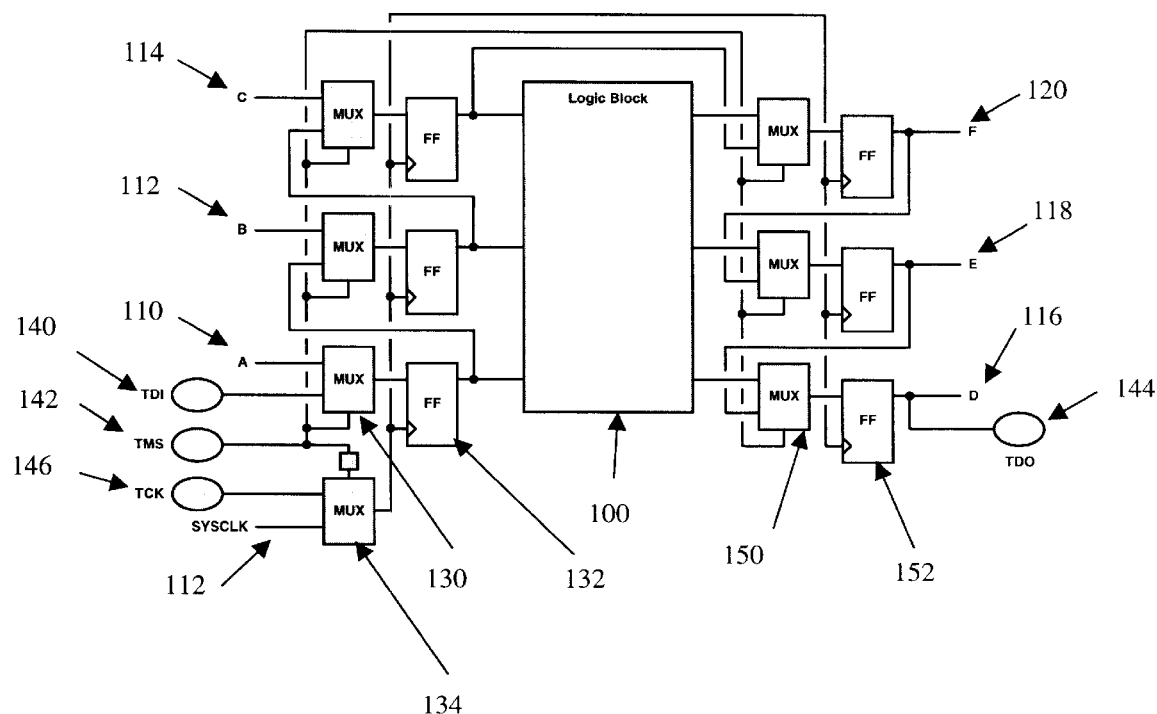
FIG. 3 shows a logic block with a scan wrapper.

FIG. 3 shows a typical scan wrapper in further detail, as is known to the art. Logic block 100 has inputs 110, 112, 114 and outputs 116, 118, 120. The scan wrapper consists of multiplexers 130, 150 and flip flops 132, 152.

Under normal device operation, control signal TMS 142 gates input signal 110 through multiplexer 130 and flip flop 132 directly to logic block 100. Other inputs 112, 114 operate in a similar fashion. Also, under normal device operation, signal TMS 142 gates output signal from logic block 100 through multiplexer 150 and flip flop 152 to output pin 116. Other outputs 118, 120 operate similarly. Also under normal operation, system clock 112 passes through multiplexer 134 and clocks flip flops 132, 152, latching input and output signals to and from logic block 100 to their respective pins.

In test mode, signal TMS 142 changes the state of multiplexers 130, 134, and 150, connecting the scan path cells as a long shift register under the control of serial input line TDI 140 and test clock TCK 146. Inputs present at serial input line TDI 140 are shifted through flip flops 132 under control of test clock TCK 146. Similarly, outputs are shifted out serial output line TDO 144. This scan wrapper thus allows all inputs of the logic block under control of the scan wrapper to be set, and all outputs of the logic block under control of the scan wrapper to be read, all in serial fashion.

Figure 4:
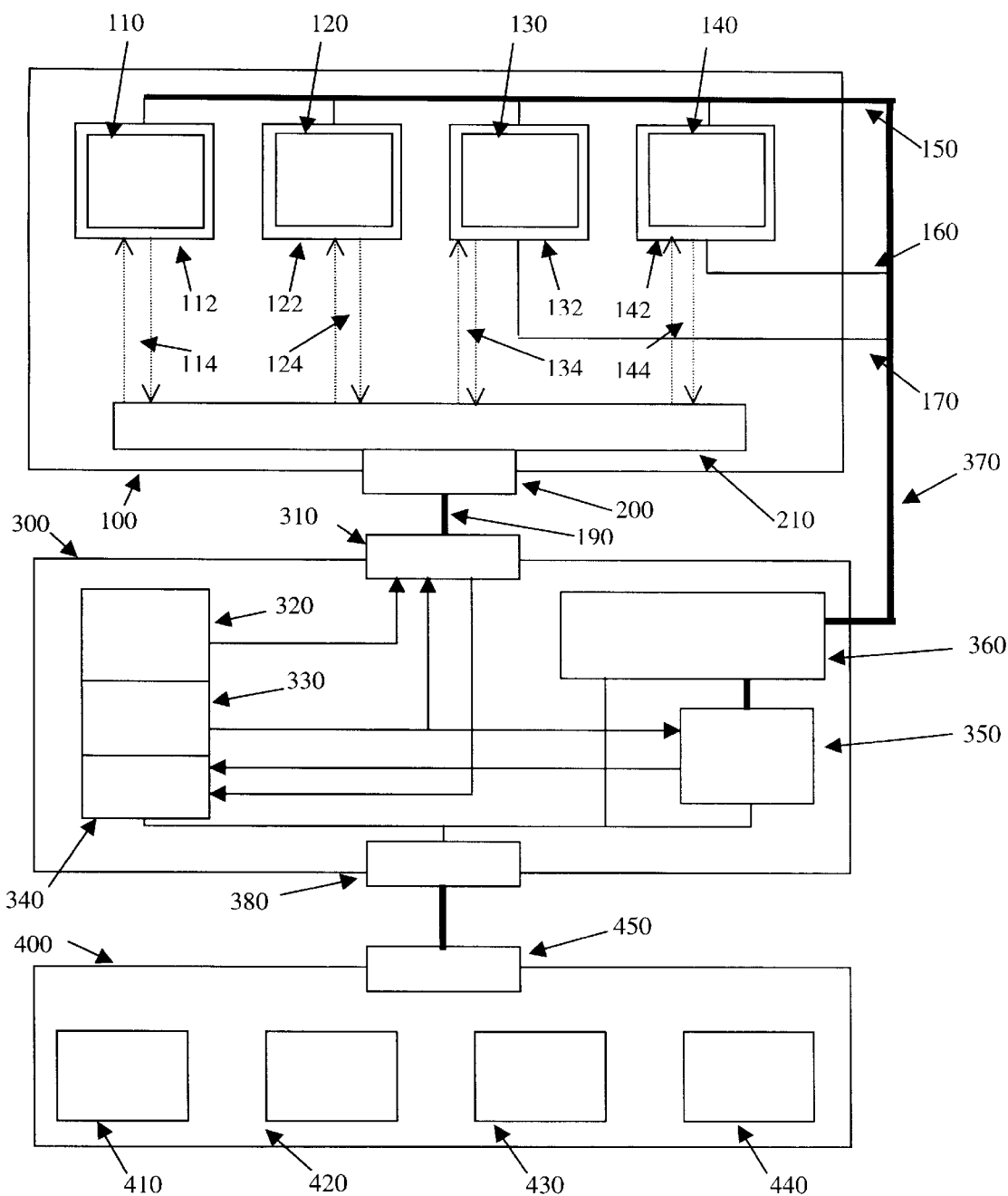
FIG. 4 shows a scan path tester according to the present invention.

In the present invention, as shown in FIG. 4, relies on information used during the design process to produce an inexpensive device tester for SOC or similar devices. As shown previously, the SOC device-under-test (DUT) 100 is comprised of a number of internal functional blocks 110, 120, 130, 140 which have been wrapped with scan path logic 112, 122, 132, 142. These scan path chains 114, 124, 134, 144 connect through chain selector 210 to TAP 200. In the IEEE 1149.1 standard, interface 190 includes signals TDI, TDO, TMS, TCK, and optionally TRST* for controlling test access port operation.

Rather than use a large and expensive general purpose tester as has been done previously, the present invention relies on a smaller, less expensive scan path tester 300. This tester consists of TAP interface 310 which is controlled by TAP controller 320. TAP controller 320 generates the signals needed for setup and testing, such as TMS, TCK, and TRST* used in IEEE1491.1. Pattern generator 330 generates test patterns for both device under test (DUT) 100 and the equivalent functional block 350. Comparison logic 340 compares the outputs of DUT 100 and the equivalent functional block 350. Boundary condition logic 360 supplies equivalent signals from ports 150, 160, and bus 170 of the DUT to the equivalent functional block 350.

While the logic of scan path tester 300 may be implemented in a number of forms, it may be implemented using field programmable gate arrays (FPGAs), as is equivalent logic block 350. Equivalent logic block 350 is implemented using programmable logic, preferably an SRAM-based FPGAs from companies such as those from Xilinx or Altera. These SRAM-based FPGAs may be reconfigured quickly to perform many complex logic functions.

In operation, host system 400, typically a personal computer or workstation, communicates through control port 450 to control port 380 of scan path tester 300. Host computer 400 contains synthesized FPGA equivalents 410, 420, 430, and 440 for the functional blocks 110–112, 120–122, 130–132, and 140–142 of DUT 100. These FPGA equivalents plus the scan wrapper are synthesized into FPGA form from the same design data used to create DUT 100. Under control of host computer 400, a particular functional block 410–440 is selected and loaded into equivalent logic block 350. Necessary test patterns are loaded into scan path tester 300, which then uses access ports 310 and 200 to select and exercise the selected functional block of DUT 100. Boundary conditions needed to test DUT 100 and equivalent logic block 350 are set using FPGA logic 360.

Since the same design data is used in the selected functional block of DUT 100 as is loaded into equivalent functional block 350, testing of the selected functional block is simplified. With the availability of high speed FPGAs, a combination of scan path testing and at-speed testing may be performed at much lower cost than with general purpose device testers. With scan path testing, the device is stopped, test vectors toggled into the selected scan chain 114, 124, 134, or 144, the device clock is toggled for the required number of periods, and the test outputs are clocked out and verified with the results of equivalent logic block 350.

The foregoing detailed description of the present invention is provided for the purpose of illustration and is not intended to be exhaustive or to limit the invention to the precise embodiments disclosed. Accordingly the scope of the present invention is defined by the appended claims.

What is claimed is:

1. A method of testing an integrated circuit designed using functional blocks comprising the steps of:

adding test wrappers consisting of scan path cells for selected functional blocks to the design of the integrated circuit, testing the integrated circuit by selecting a functional block having a test wrapper and comparing the behavior of that block to its high level model.

2. A method of testing an integrated circuit designed using functional blocks and including test wrappers of scan path cells surrounding selected functional blocks comprising:

selecting a functional block including a test wrapper, generating a stimulus, applying the stimulus to the selected functional block using the test wrapper, comparing the outputs of the functional block and the simulation of the functional block.

3. The method of claim 2 where the step of generating a stimulus uses block level structural test patterns.

4. The method of claim 2 where the step of generating a stimulus uses a pseudo-random sequence.

5. The method of claim 2 where the step of generating a stimulus uses expected defect and fault models.

6. A method of testing an integrated circuit designed using functional blocks and including test wrappers of scan path cells surrounding selected functional blocks comprising:

selecting a functional block including a test wrapper, loading a simulation model of the selected block into a programmable device, generating a stimulus, applying the stimulus to the selected functional block using the test wrapper, applying the stimulus to the programmable device containing the simulation model of the selected block, and comparing the outputs of the functional block and the programmable device.

7. The method of claim 6 where the programmable device is a field programmable gate array.

8. The method of claim 6 where the step of generating a stimulus uses block level structural test patterns.

9. The method of claim 6 where the step of generating a stimulus uses a pseudo-random sequence.

10. The method of claim 6 where the step of generating a stimulus uses expected defect and fault models.

11. A method of testing an integrated circuit designed using functional blocks and including test wrappers of scan path cells surrounding selected functional blocks comprising:

selecting a first functional block including a test wrapper, loading a first simulation model of the first selected block into a programmable device, testing the first selected block against the simulation model of the first selected block loaded into the programmable device, selecting a second functional block including a test wrapper, loading a second simulation model of the second selected block into the programmable device, and testing the second selected block against the simulation model of the second selected block loaded into the programmable device.

12. The method of claim 11 where the programmable device is a field programmable gate array.

13. The method of claim 11 where the steps of testing each selected block against the corresponding block-in the simulation model further comprises:

generating a stimulus, applying the stimulus to the selected functional block using the test wrapper, applying the stimulus to the programmable device containing the simulation model of the selected block, and comparing the outputs of the functional block and the programmable device.

14. The method of claim 13 where the step of generating a stimulus uses block level structural test patterns.

15. The method of claim 13 where the step of generating a stimulus uses a pseudo-random sequence.

16. The method of claim 13 where the step of generating a stimulus uses expected defect and fault models.

* * * * *